(12) United States Patent
Kumar et al.

(10) Patent No.: US 6,491,835 B1
(45) Date of Patent: Dec. 10, 2002

(54) METAL MASK ETCHING OF SILICON

(75) Inventors: Ajay Kumar, Sunnyvale, CA (US); Anisul Khan, Sunnyvale, CA (US); Wei Liu, Sunnyvale, CA (US); John Chao, San Jose, CA (US); Jeff Chinn, Foster City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/467,560

(22) Filed: Dec. 20, 1999

(51) Int. Cl.$^7$ .......................... H01L 21/00; C23C 14/34
(52) U.S. Cl. ..................... 216/51; 216/41; 216/79; 438/717; 438/719; 438/736; 438/738
(58) Field of Search .................... 438/706, 717, 438/719, 736, 738, 945; 216/41, 51, 79

(56) References Cited

U.S. PATENT DOCUMENTS

| | | | |
|---|---|---|---|
| 3,795,557 A | * 3/1974 | Jacob | 216/72 |
| 5,368,685 A | 11/1992 | Kumihashi et al. | 156/643 |
| 5,411,631 A | * 5/1995 | Hori et al. | 216/72 |
| 5,536,364 A | 7/1996 | Yoshida et al. | 156/643.1 |
| 5,605,603 A | 2/1997 | Grimard et al. | 156/662.1 |

FOREIGN PATENT DOCUMENTS

| | | | |
|---|---|---|---|
| DE | 3026911 | * 2/1982 | |
| EP | 222739 | 5/1987 | G03F/1/00 |
| EP | 581280 | 2/1994 | G03F/007/20 |
| JP | 8203875 | 8/1996 | H01L/021/3065 |
| RU | 2009576 | 3/1994 | H01L/21/78 |
| WO | WO 9936947 | 7/1999 | H01L/021/00 |

* cited by examiner

*Primary Examiner*—Gregory Mills
*Assistant Examiner*—Sylvia R MacArthur
(74) *Attorney, Agent, or Firm*—Shirley L. Church; Joseph Bach (57) ABSTRACT

The present disclosure provides a method for etching trenches, contact vias, or similar features to a depth of 100 μm and greater while permitting control of the etch profile (the shape of the sidewalls surrounding the etched opening). The method requires the use of a metal-comprising masking material in combination with a fluorine-comprising plasma etchant. The byproduct produced by a combination of the metal with reactive fluorine species must be essentially non-volatile under etch process conditions, and sufficiently non-corrosive to features on the substrate being etched, that the substrate remains unharmed by the etch process. Although aluminum is a preferred metal for the metal-comprising mask, other metals can be used for the masking material, so long as they produce an essentially non-volatile, non-corrosive etch byproduct under etch process conditions. By way of example, and not by way of limitation, metallic materials recommended for the mask include aluminum, cadmium, copper, chromium, gallium, indium, iron, magnesium, manganese, nickel, and combinations thereof. In particular, aluminum in combination with copper or magnesium is particularly useful, where the copper or magnesium content is less than about 8% by weight, and other constituents total less than about 2% by weight. The plasma feed gas includes at least one fluorine-containing compound such as nitrogen trifluoride ($NF_3$), carbon tetrafluoride ($CF_4$), and sulfur hexafluoride ($SF_6$), by way of example and not by way of limitation. Oxygen ($O_2$), or an oxygen-comprising compound, or hydrogen bromide (HBr), or a combination thereof may be added to the plasma feed gases to help provide a protective layer over etched sidewalls, assisting in profile control of the etched feature.

13 Claims, 5 Drawing Sheets

METAL MASK ETCHING OF SILICON

BACKGROUND OF THE INVENTION

1. Field of the Invention

The present invention pertains to a method for plasma etching deep trenches, typically at least 50 μm deep, into a silicon substrate while maintaining control over the sidewall profiles which border the trench.

2. Brief Description of the Background Art

In semiconductor device fabrication, it is frequently desirable to create deep trenches in a silicon substrate. Typically silicon dioxide has been used as a masking material for plasma etching of trenches in an underlying silicon substrate. The plasma etch selectivity of silicon relative to silicon oxide, i.e. the ratio of the silicon etch rate to the silicon oxide etch rate, is up to about 40:1, depending on the composition of the plasma etchant. The trench is typically etched in a silicon substrate using a plasma feed gas comprising chlorine, or oxygen, or a combination thereof. The plasma feed gas may include small amounts of $SF_6$, added for profile control.

While 40:1 selectivity is acceptable for a number of fabrication applications, such as gate type field effect transistors, it is not adequate for many micromachining applications, or for fabrication of deep trench capacitors, deep trench isolation (DTI) for high frequency circuitry, power devices, and numerous other applications. For example, with respect to especially deep trenches of the kind required for deep trench capacitors used in DRAM cells where the trench may be 200 μm deep, a 40:1 selectivity would require a silicon oxide mask thickness of about 5 μm, which causes numerous problems. Use of such a thick masking layer of silicon oxide makes it more difficult to control the sidewall profile of the trench as it is etched; since, as etching progresses the edges of the masking layer above the opening are eroded away and the shape at the top of the opening changes.

It is highly desirable to have a thin masking layer which has a sufficiently low etch rate compared to that of silicon that the selectivity is extended beyond 40:1.

SUMMARY OF THE INVENTION

The present invention provides a method for etching trenches, contact vias, or similar features to a depth of 100 μm and greater while permitting control of the etch profile (the shape of the sidewalls surrounding the etched opening). The method requires the use of a metal-comprising masking material in combination with a fluorine-comprising plasma etchant. The byproduct produced by a combination of the metal with reactive fluorine species must be essentially non-volatile under etch process conditions, and sufficiently non-corrosive to features on the substrate being etched, that the device features remain unharmed by the etch process. By unharmed it is meant that performance of a semiconductor device feature in the substrate is not affected, or that any residue from the etch process that could affect feature performance can be removed to leave the device feature essentially unaffected.

Although aluminum is a preferred metal for the metal-comprising mask, since aluminum is already present in most semiconductor processing chambers and the effect produced by the presence of aluminum in most semiconductor processes is known, other metals can be used for the masking material, so long as they produce an essentially non-volatile, non-corrosive etch byproduct under etch process conditions. By way of example, and not by way of limitation, metallic materials recommended for the mask include aluminum, cadmium, copper, chromium, gallium, indium, iron, magnesium, manganese, nickel, and combinations thereof. In particular, aluminum in combination with copper or magnesium is particularly useful, where the copper or magnesium content is less than about 8% by weight, and other constituents total less than about 2% by weight.

The plasma feed gas includes at least one fluorine-containing compound such as nitrogen trifluoride ($NF_3$), carbon tetrafluoride ($CF_4$), sulfur hexafluoride ($SF_6$), silicon tetrafluoride ($SiF_4$), trifluoro methane ($CHF_3$), difluoro methane ($CH_2F_2$) and perfluoro 1-butene, or perfluoro 2-butene, or perfluoro cyclobutane ($C_4F_8$), by way of example and not by way of limitation.

Oxygen, or an oxygen-comprising compound may be added to the plasma feed gases to help provide a protective layer over etched sidewalls, assisting in profile control of the etched feature. The preferred atomic ratio of oxygen:fluorine in the plasma feed gas ranges from about 0.25 to about 0.50. Plasma feed gases comprising $CH_2F_2$ and $SF_6$, and $O_2$; or comprising $C_4F_8$ and $SF_6$, and $O_2$ work well, for example and not by way of limitation.

The addition of hydrogen bromide (HBr) to the plasma feed gas also helps protect sidewall integrity. And, although the non-HBr chemistries mentioned above work well, they are compound depositing in nature, so that a combination of HBr with $SF_6$ and $O_2$, for example provides a cleaner process and is preferred.

DETAILED DESCRIPTION OF THE INVENTION

1. Definitions

As a preface to the detailed description, it should be noted that, as used in this specification and the appended claims, the singular forms "a", "an", and "the" include plural referents, unless the context clearly dictates otherwise. Thus, for example, the term "semiconductor" includes a variety of different materials which are known to have the behavioral characteristics of a semiconductor, reference to a "metal" or "metallic" masking material includes metals such as aluminum, cadmium, copper, chromium, gallium, indium, iron, manganese and nickel, as well as other conductive materials which would be suitable in the application described.

Specific terminology of particular importance to the description of the present invention is defined below.

The term "bias power" refers to, but is not limited to, the power applied to a substrate to increase the attraction of ions toward a substrate, thereby increasing the anisotropicity of a plasma etching process.

The term "etch structure", "etch stack" or "film stack" refers to a collection of layers of different materials deposited one over the other, at least a portion of which are etched during an etching process.

The term "etch profile" or "feature profile" generally refers to, but is not limited to, the cross-sectional profile of the sidewall of an etched feature. In many instances herein, the etch profile is described in terms of an angle between the sidewall and the surface on which the feature stands (i.e., the substrate). The term "vertical profile" refers to a feature profile wherein a cross-section of the feature exhibits sidewalls which are perpendicular to the surface on which the feature stands. The term "reentrant profile" (also known as an "undercut" profile) refers to a feature profile wherein the width of the cross-section of the feature is larger as the distance away from the opening on the substrate increases. The term "tapered" profile refers to a feature profile wherein the width of the cross-section of the feature is smaller as the distance away from the opening on the substrate surface increases.

The term "feature" refers to, but is not limited to, contacts, vias, trenches, and other structures which make up the topography of the substrate surface.

The term "feature size" typically refers to the smallest dimension of a feature (i.e., the shortest distance between the sidewalls of a feature).

The term "selectivity" or "etch selectivity" is used to refer to (a) a ratio of etch rates of two materials; and (b) a condition achieved during etch when etch rate of one material is increased in comparison with another material.

The term "source power" refers to the power that is responsible for sustaining the plasma and providing the energy to high energy species in the chamber.

The term "substrate" includes semiconductor materials, glass, ceramics, polymeric materials, and other materials of use in the semiconductor industry.

2. An Apparatus for Practicing the Invention

The present invention may be practiced in any apparatus adapted to expose a substrate to a plasma. Preferably the apparatus is capable of applying a bias voltage to the substrate. An apparatus which has provided excellent results employs an inductively coupled plasma, where a power supply to an inductive coil and a power supply to bias the substrate are independently controlled. This enables the selection of a desired plasma density independently of the selection of the amount of energy with which ion bombardment occurs upon the substrate surface.

However, the present invention may be practiced in an apparatus having a plasma source power and bias power which are not separately controllable, or in any other type of apparatus adapted to expose a substrate to a plasma.

The CENTURA® DPS Plus™ silicon etch system available from Applied Materials, Inc. of Santa Clara, Calif. is an example of a system which provides independent control of the source power supply and the bias power supply.

Figure 1:
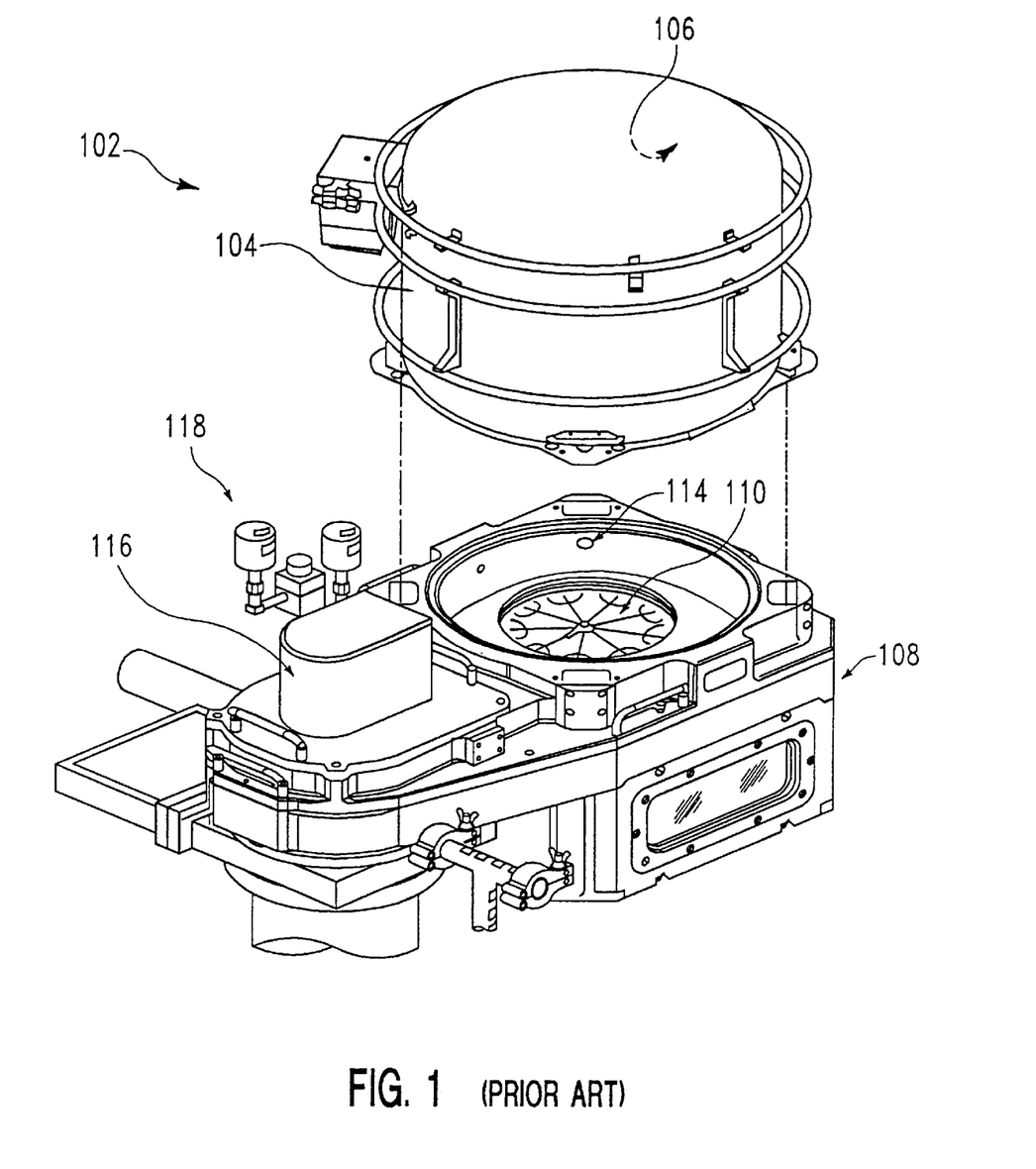
FIG. 1 is a schematic of an individual polysilicon etch chamber 102 of the type used in an Applied Materials' CENTURA® DPS Plus™ silicon etch system, which is a preferred example of an etch processing apparatus for performing the method of the invention.
Figure 2:
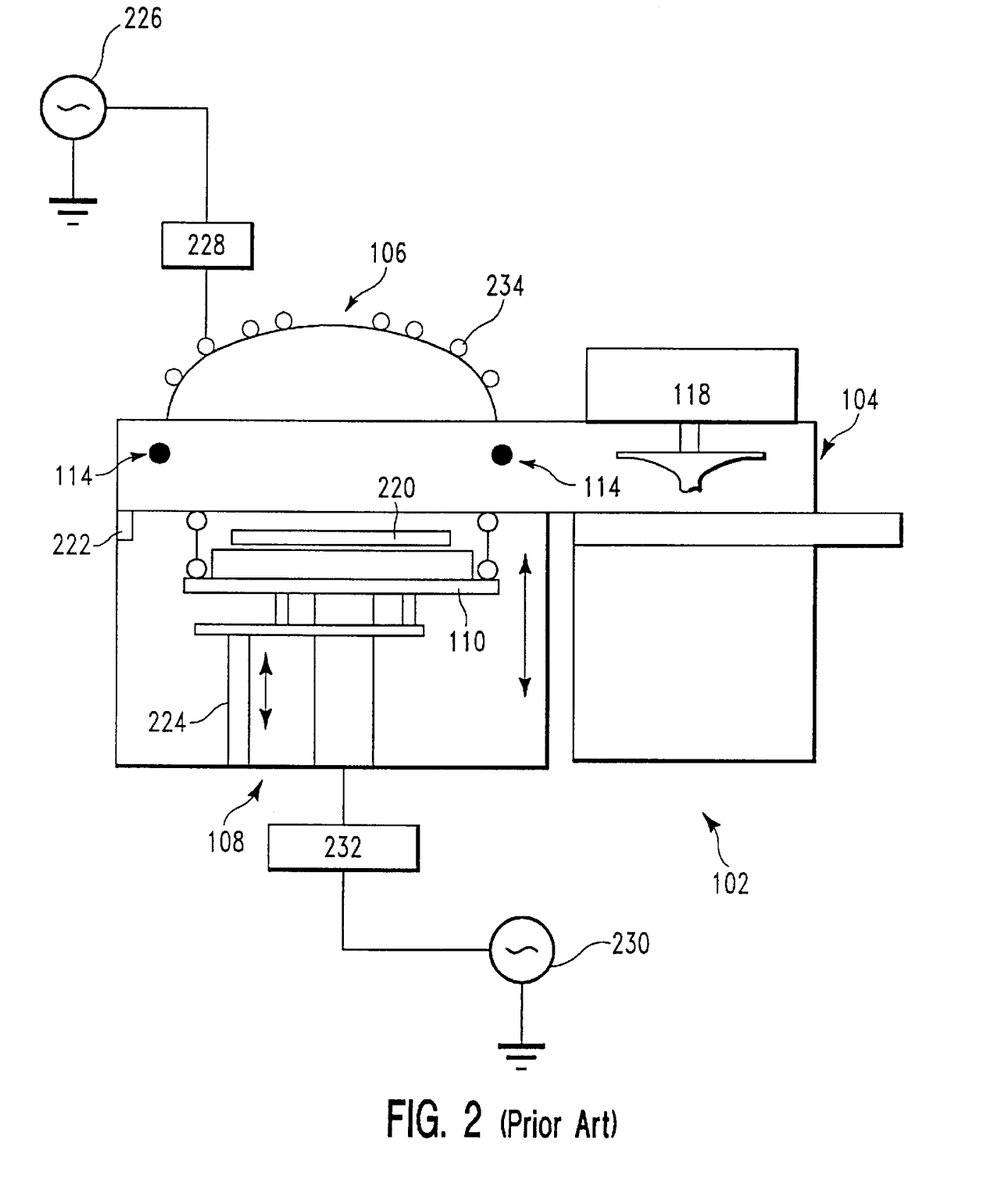
FIG. 2 shows a cross-sectional side view of the silicon etch chamber 102 shown in FIG. 1.

FIGS. 1 and 2 are schematics of an individual CENTURA® DPS Plus™ silicon etch chamber 102 of the type used in the Applied Materials' CENTURA® silicon etch system. The CENTURA® DPS Plus™ polysilicon etch chamber 102 is configured to be mounted on a standard CENTURA® 5200 etch mainframe. The polysilicon etch chamber 102 comprises an upper chamber 104 having an internal ceramic dome 106, and a lower chamber 108. The lower chamber 108 includes a monopolar electrostatic chuck (ESC) cathode 110. Gas is introduced into the chamber via ceramic gas injection nozzles 114. Chamber pressure is controlled by a closed-loop pressure control system 118 with a throttle valve 116.

FIG. 2 shows a schematic of a cross-sectional side view of a polysilicon etch chamber 102. During processing, a substrate 220 is introduced into the lower chamber 108 through inlet 222. The substrate 220 is held in place on the surface of electrostatic chuck (ESC) cathode 110 by applying a DC voltage to a conductive layer (not shown) located under a dielectric film (not shown) on the chuck surface. The cathode 110 and substrate 220 are raised by a wafer lift 224 and so that cathode 110 and substrate 220 are raised into position for processing. Etch gases are introduced into the upper chamber 104 via the ceramic gas injection nozzles 114. The polysilicon etch chamber 102 employs an inductively coupled plasma generated using inductive coil 234, to which power is applied via power source 226 and matching network 228 operating at substantially 12.56 MHZ. A high density plasma can be generated and sustained using this apparatus. The wafer 220 is biased by application of power applied through cathode 110 via an RF source 230 and matching network 232 operated at substantially 13.56 MHZ. The plasma source power 226 and substrate biasing via RF source 230 are controlled by separate controllers (not shown). When an etch end point is evidenced by etching to an interface between two different materials, an endpoint subsystem (not shown) senses the end of the etch process by monitoring changes in the light emitted by the plasma in the etch chamber 102.

3. The Method for Metal Mask Etching of Silicon

As previously mentioned, silicon is typically plasma etched using a plasma feed gas comprising chlorine and oxygen. However, the etchant species provided by this plasma feed gas provide an etch selectivity of silicon relative to silicon oxide which is in the range of about 40:1. To etch a trench 300 μm deep, the silicon oxide etch mask must be at least 7.5 μm (75,000 Å) thick. Use of such a thick mask creates very significant stress on the underlying substrate surface; the silicon oxide mask itself may crack from the stresses created at such thicknesses. These factors, and others, make the use of a mask of this thickness economically impractical. To improve the selectivity of silicon relative to the masking material, a number of different masking materials were considered. We decided to investigate the use of metal-comprising masking materials.

A useful metal-comprising masking material etches slowly in comparison to the silicon etch rate, and the etch byproducts formed should not harm the etched semiconductor structure or features contained therein. We have discovered that if the etch byproducts from the metal-comprising masking material are sufficiently nonvolatile, they can be used to limit the etch rate of the masking material, providing an etch selectivity of silicon relative to the metal-comprising masking material which is significantly better than 40:1. When a major component of the metal-comprising masking material is aluminum, we have determined that the reaction by-product between a fluorine-comprising etchant and the aluminum helps reduce the etch rate of the aluminum-comprising masking material and is substantially non-corrosive, providing an advantageous etch process. The etch byproduct of aluminum and chlorine etchant species is too volatile to sufficiently reduce the aluminum-comprising mask etch rate. Iodine etchant species were not selected due to the difficulty in handling iodine and the volatility of the by-product formed from the aluminum-iodine species reaction. The etch byproduct of aluminum with bromine is very corrosive. It is particularly helpful that the aluminum fluoride ($AlF_3$) byproduct melting point at standard conditions is about 1290° C., at which temperature it sublimes (reducing any potential for corrosion). One skilled in the art, using published handbooks which provide physical and chemical property data for metal compounds, can select combinations of other metals with known-in-the-art etchants to arrive at metal/etchant byproducts which are highly likely to provide the desired non-volatility and non-corrosive properties to function within the description of the present invention.

EXAMPLE ONE

Eight individual etch experiments were carried out in this Example. The substrate wafer size was 200 mm, and the wafer was notched. Three wafers were available, and to obtain maximum information using a single wafer, portions of the wafer were protected during an etch process, so that a wafer could be reused. The etch process was performed in a CENTURA® DPS Plus™ polysilicon etch chamber of the kind previously described. This etch chamber was equipped with a heat exchanger to control the dome and wall temperature and a separate heat exchanger to control the temperature of the electrostatic chuck cathode upon which the wafer substrate rested.

Figure 3A:
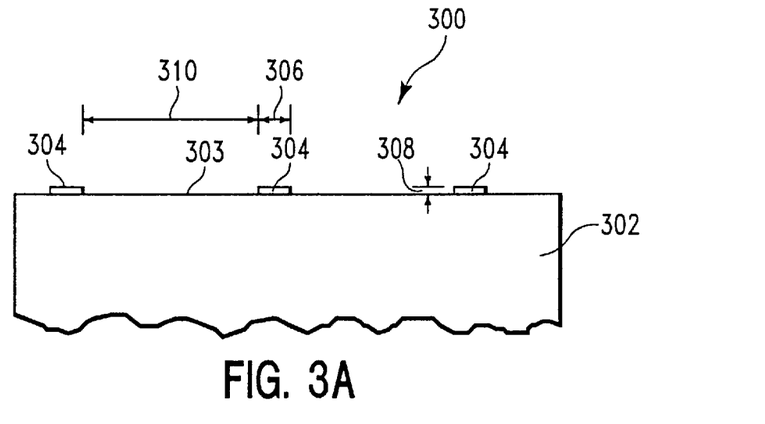
FIG. 3A shows a schematic of a cross-sectional view 300 of the Example One etch structure, consisting of a silicon substrate having an aluminum mask of lines and spaces deposited thereover. The aluminum mask lines 304 rest on the upper surface 303 of the silicon substrate 302 are shown as FIG. 3B shows the etch structure of FIG. 3A after completion of etch.

FIG. 3A shows a schematic of a cross-sectional view of a film structure for a wafer portion 300 which was etched. The substrate 302 was single crystal silicon. Overlying substrate 302 upper surface 303 was a pattern of aluminum lines 304, each having a width 306 of 100 μm and a thickness 308 of 1.7 μm, with a spacing 310 of 2 mm separating each line 304. The schematic is not to scale.

Prior to beginning etch of the single crystal silicon substrate 302, a "breakthrough" plasma etch step was carried our using an argon/chlorine plasma source gas, for purposes of removing residual aluminum still present at the mask open area (overlying spaces 310). The breakthrough process conditions were: process chamber pressure 10 mTorr; plasma source power 750 Watts; substrate bias power 175 Watts; argon flow rate 175 sccm; chlorine flow rate 20 sccm; chamber wall temperature 65° C.; cathode temperature 10° C.; etch time 20 min.

The etch conditions for each of the eight experiments and the etch results are presented in Table I, below.

The optimum for a vertical trench wall profile would be a ratio of 1.0.

The data in Table 1, above, indicates that an increase in $O_2$ flow rate to the plasma source gas provides a more vertical trench sidewall profile. This data, in combination with data described subsequently indicates that an increase in the volumetric gas feed ratio of $O_2:SF_6$ up to about 1.7 is expected to provide a more vertical profile, depending on other variable nominal values. For the specific ranges of variables presented in Table I and Table II, an increase in the volumetric gas feed ratio of $O_2:SF_6$ up to about 1.2 provides a more vertical trench sidewall profile.

A review of the experimental data indicates that a more vertical etched sidewall profile may be achieved by addition of HBr to the plasma feed gas. However, other process variables must be adjusted to accommodate the use of HBr. We have discovered that the addition of HBr to the plasma feed gas may result in more undercutting of the etch profile (i.e. a higher ratio of line width at the mask to line width at the base of the trench wall), if other process variables are not properly adjusted. This is an unexpected result, as the addition of HBr typically protects the sidewall of the trench during etching, enabling a more vertical trench sidewall profile. In particular, the pressure in the process chamber during etching of the silicon substrate preferably ranges from about 5 mTorr to about 50 mTorr. When HBr is added to the plasma feed gas, a decrease in process chamber pressure from about 50 mTorr to about 20 mTorr provides a more vertical etch sidewall, all other factors held constant. A further decrease below about 20 mTorr results in undercut, reentrant profiles, which are undesirable. In addition to adjustment of the process chamber pressure, we have obtained good results when the volumetric flow rate of $SF_6$ is about the same as, or slightly less than the flow rate of the HBr.

When HBr is not present in the process gases, an increase in process chamber pressure from about 20 mTorr to about 30 mTorr provides a more vertical trench wall profile, where the ratio of line width at the mask to line width at the base of the trench sidewall is decreased.

An increase in substrate bias from 20 W to 50 W produced a more vertical trench sidewall. Substantially inert diluent gases may be present in the feed gas for purposes of process control; these include argon and helium, by way of example and not by way of limitation.

Figure 3B:
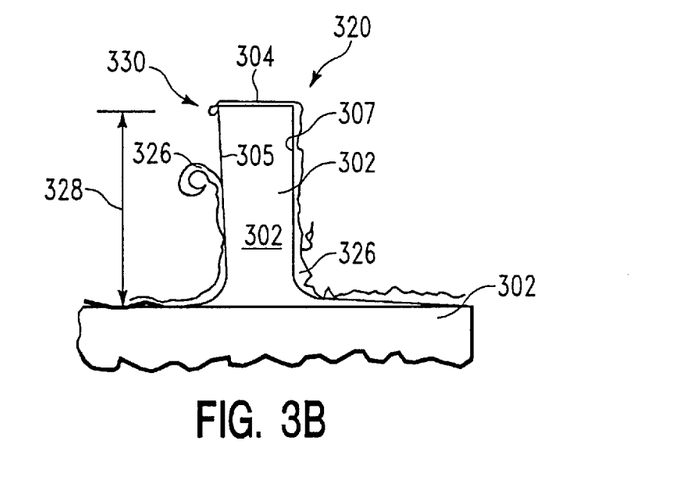
Figure 3C:
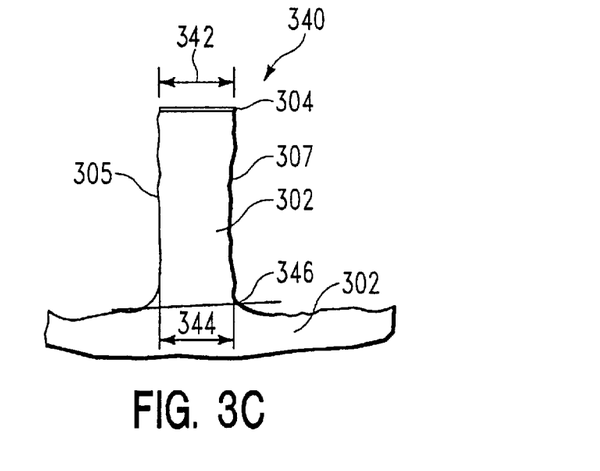
FIG. 3C shows the etch structure of FIG. 3B after a clean-up procedure in which the etched structure is dipped in a dilute HF solution to remove residual oxides from the surface of the structure.

FIG. 3B is a schematic of a cross-sectional view 320 of the etched trench sidewalls 305 and 307 in polysilicon 302 underlying aluminum line 304. This schematic is taken from a photomicrograph of the etched substrate of Experiment No. 5 shown in Table I, where the depth of etch 328 is 208 μm. The remaining aluminum mask thickness 330 was approximately 1.0 μm of the 1.7 μm originally present. The build-up 326 on sidewalls 305 and 307 was analyzed using Electron Diffraction Spectroscopy (EDS). The build-up 326 appears to be mainly silicon, fluorine, and aluminum, with minor amounts of oxygen present. The build-up was subsequently removed by dipping the substrate in a solution of HF in $H_2O$, where the weight ratio of $HF:H_2O$ was 1:100, for a time period of about one minute at ambient temperature. FIG. 3C shows the cross-sectional view 340 schematic of FIG. 3B after the dip in the HF solution. The ratio of line width 342 at mask 304 to line width 344 at the base 346 appears for each Experiment No. in the Results section of Table I.

EXAMPLE TWO

Figure 4A:
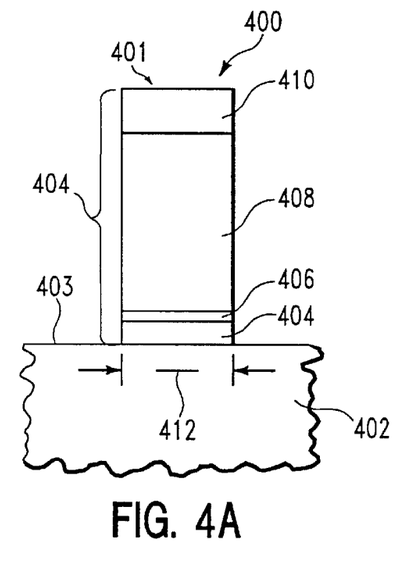
FIG. 4A shows a schematic of a cross-sectional view 400 of the Example Two etch structure, consisting of a pattern of lines 404 resting on the upper surface 403 of a single crystal substrate 402. In the area of lines 404, the single crystal silicon substrate 402 upper surface 403 has a layer of TEOS 404 in direct contact with upper surface 403, a layer of $Si_3N_4$ 406 overlying the TEOS layer 404, a masking layer 408 of Al—Cu overlying the $Si_3N_4$ layer 406, and a second TEOS layer 410 overlying the Al—Cu masking layer 408.

In this Example, 5 experiments were conducted. The film substrate etched was similar to that described with reference to EXAMPLE ONE in terms of the width of the lines and spaces between the lines. However, the line structure was different, as is illustrated in FIG. 4A. The film structure 400 included a line 401 resting on the upper surface 403 of single crystal silicon substrate 402. Line 401 had an overall thickness 404 of 5.34 μm, including: a 4,000 Å thick layer of TEOS 404 in direct contact with upper surface 403; a 1,400 Å thick layer of $Si_3N_4$ 406 overlying the TEOS layer 404; a 40,000 Å (4.0 μm) thick masking layer 408 of Al—Cu overlying the $Si_3N_4$ layer 406; and a second, 8,000 Å thick TEOS layer 410 overlying the Al—Cu masking layer 408.

A pre-clean plasma etch step is optional prior to the etch step described in Table II below. When it is used, it is for purposes of removing debris (such as native oxide) from the portion of the substrate surface exposed by the mask. In the present Example Two, a pre-clean plasma etch step was carried out prior to etching of the silicon substrate 402. The pre-clean plasma etch step is typically performed using a plasma generated from a plasma feed gas comprising carbon and fluorine. In this instance the plasma feed gas was $CF_4$ at about 80 sccm; the process chamber pressure was about 6 mTorr; the plasma source power was about 600 W; the substrate bias power was about 90 W; the cathode temperature was about 10° C., the process chamber wall temperature was about 55° C., and the pre-clean etch time was about 10 seconds.

The etch conditions and the etch results for etching of the silicon substrate is provided in Table II below for each of the five etch experiments.

Figure 4B:
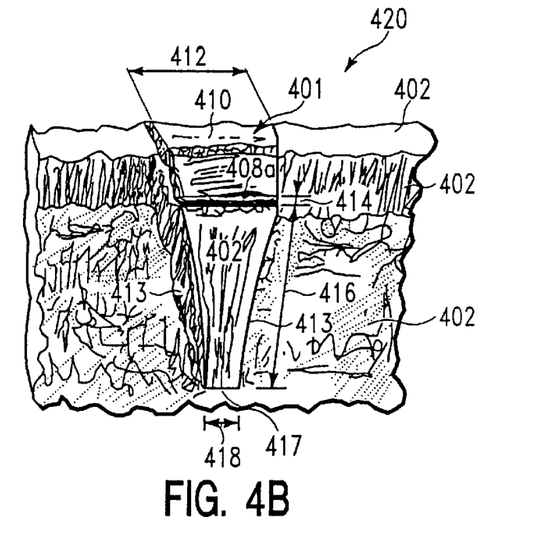
FIG. 4B shows a schematic of a photomicrograph taken after etching of the film structure 400 shown in FIG. 4A, where a portion of Al—Cu masking layer 408a has been plasma etched, while another portion 408b has been protected from the etchant plasma. The line 404 etched into silicon substrate 404 is considerably wider at the Al—Cu masking layer than at the base of the etched silicon 417, i.e. the line sidewall profile is significantly undercut.

FIG. 4B a schematic of a photomicrograph taken from Experiment No. 5, after etching of the film structure 400 shown in FIG. 4A, where a portion of Al—Cu masking layer 408a has been plasma etched, while another portion 408b has been protected from the etchant plasma. FIG. 4B shows the etched structure from Experiment 5 in Table II, where the etch depth 416 into the polysilicon 402 was 428 μm. The line 401 etched into silicon substrate 404 is considerably wider at the Al—Cu masking layer than at the base of the etched silicon 417 (having a Ratio of Line Width At Mask:Etch Base of >7). This is partially the result of the longer etch time, but is attributable principally to a failure to provide sufficient protection for the etched silicon sidewall 413 during the etching process. The addition of HBr to the plasma feed gas is expected to provide sufficient etched sidewall protection to provide a significantly improved Ratio. The beneficial effect of the addition of HBr is evidenced by the Ratio of 1.0 achieved in Experiment No. 4. Recent experimentation in the etching of deep trenches has indicated that the addition of about 50 sccm to about 80sccm of HBr enables improvement of the Ratio of Line Width At Mask:Etch Base to about 1.2, all other factors held constant.

With regard to the film structure of Experiment No. 5, the thickness of the Al—Cu masking layer 408a (including the first TEOS layer 404, not shown, and the $Si_3N_4$ layer 406, not shown) remaining after etch of the silicon line 410 was approximately 4.54 μm. The 8,000 Å layer of TEOS 410 was lost, but the Al—Cu masking layer 408 loss was negligible. (The thickness of the protected Al—Cu masking layer structure 401 remained at 5.34 μm)

Figure 4C:
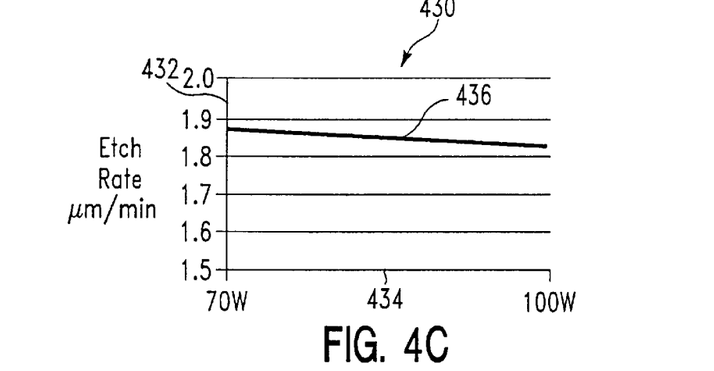
FIG. 4C is a graph showing the change in silicon etch rate as a function of the bias applied to the etch structure during etching.

FIG. 4C is a graph 430 showing the change in silicon etch rate, shown on ordinate 432, as a function of the bias power, shown on abscissa 434, which was applied to the etch structure during etching. Curve 436 shows that for a bias power increase from about 70 W to about 100 W, the etch rate dropped from approximately 1.87 μm per minute to about 1.83 μm per minute (about 2%).

Figure 4D:
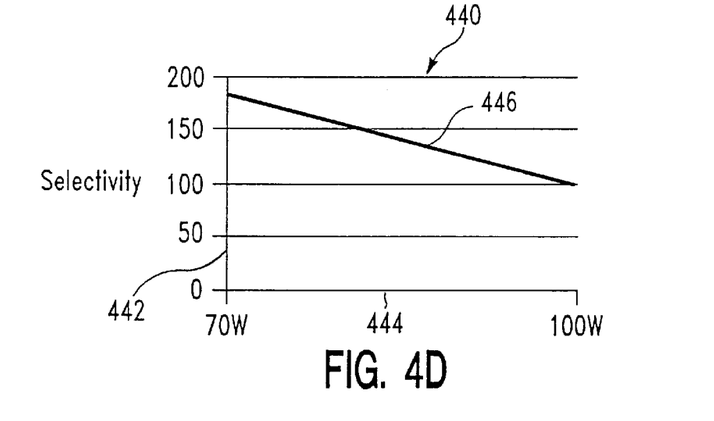
FIG. 4D is a graph showing the change in selectivity (ratio of the etch rate of silicon to the etch rate of the aluminum masking material) as a function of the bias applied to the etch structure during etching.

FIG. 4D is a graph 440 showing the change in selectivity (ratio of the etch rate of silicon to the etch rate of the aluminum masking material) on ordinate 442 as a function of the bias power, shown on abscissa 444, which was applied to the etch structure during etching. Curve 446 shows that for the bias power increase from about 70 W to about 100 W, the selectivity decreased from about 180 to about 100 (about 44.5%).

In view of the trends shown in FIGS. 4C and 4D, it becomes apparent that an increase in the bias power to the substrate has minimal effect of the etch rate of the polysilicon, but can adversely affect the selectivity for etching polysilicon relative to the metal masking layer. As described relative to EXAMPLE ONE, an increase in substrate bias from 20 W to 50 W produced a more vertical trench sidewall.

A review of the experimental data has shown that it is possible to obtain a more vertical etched sidewall when HBr is added to the plasma feed gas, provided other process variables are properly adjusted, as mentioned above.

When a vertical sidewall profile is desired for the etched feature, anisotropic etching is necessary and a bias is applied to the substrate to increase the degree of anisotropic etching. However, an increase in the amount of bias applied decreases the selectivity, so that a thicker mask is required. One skilled in the art can easily determine, for the particular processing apparatus used, the amount of bias which will provide the desired etch profile without an unacceptable reduction in selectivity, based on process requirements.

Figure 5:
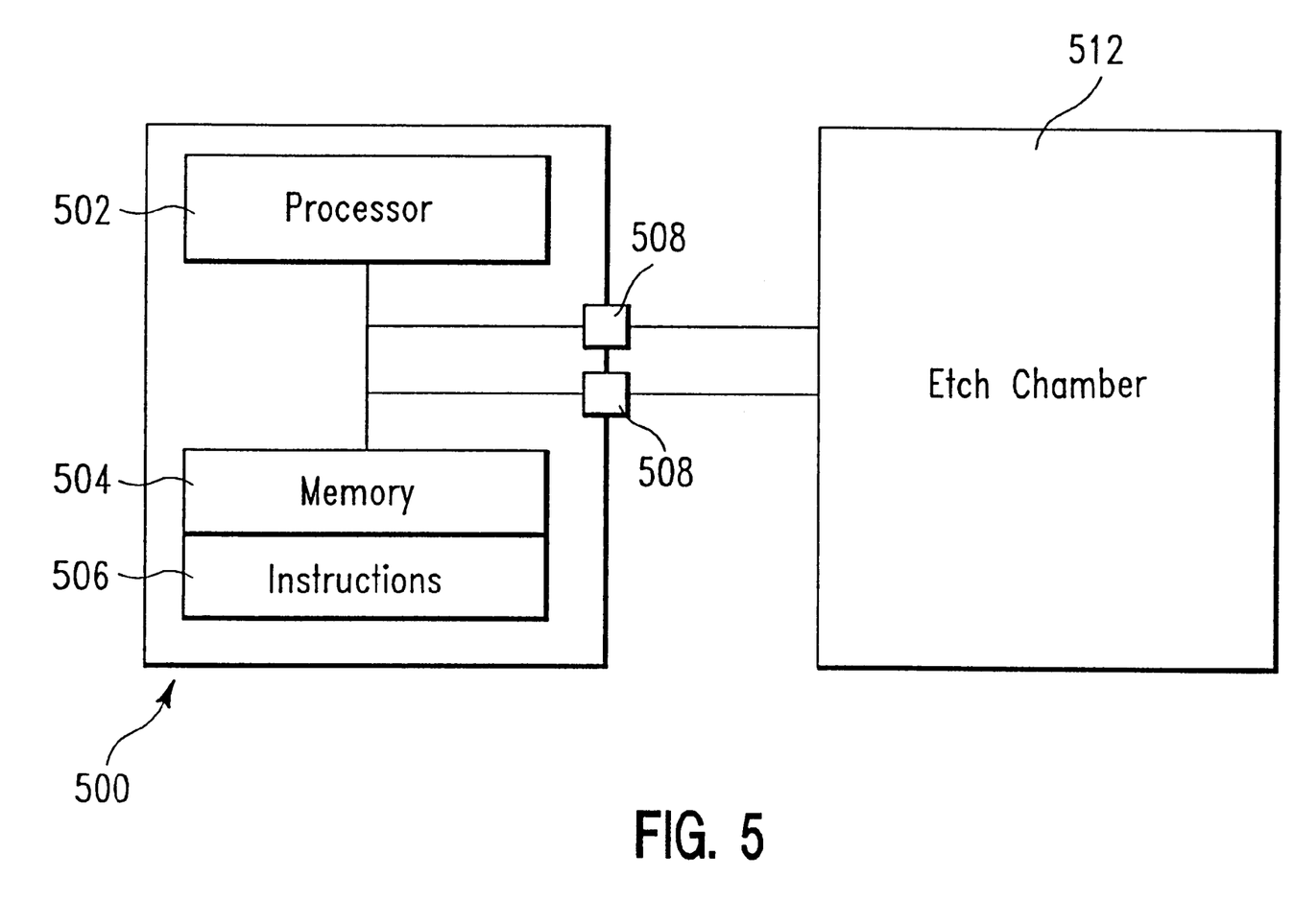
FIG. 5 is a schematic drawing of a computerized control system for use in controlling various process parameters during the plasma etching of features in silicon substrate.

Preferably, the apparatus used to practice the present invention is adapted to be controlled by a computer. FIG. 5 shows a computer 500. Computer 500 comprises a processor 502, memory 504 adapted to store instructions 506, and one or more ports 508. Processor 502 is adapted to communicate with memory 504 and to execute instructions 506. Processor 502 and memory 504 are also adapted to communicate with one or more ports 508. Ports 508 are adapted to communicate with a plasma etch chamber 512. Plasma etch chamber is adapted to carry out process steps in accordance with signals received from processor 502 via ports 508. Preferably, computer 502 can control the composition and feed rate of the plasma source gas, the temperature, the pressure in the chamber, the bias power, the plasma source generation power. Preferably, computer 502 is adapted to receive measurements that describe the condition in the chamber, and adapt the process variables accordingly. This programmed control of process variables enables production of a predetermined device etch profile as required for a given use application.

The above-described preferred embodiments are not intended to limit the scope of the present invention, as one skilled in the art can, in view of the present disclosure expand such embodiments to correspond with the subject matter of the invention claimed below.

We claim:

1. A method for plasma etching features in a silicon substrate, wherein the depth of etching into said silicon substrate is at least 100 μm, the method including using a metal-comprising masking material in combination with an etchant plasma generated from a feed gas comprising fluorine and oxygen, wherein an atomic ratio of oxygen:fluorine in said plasma feed gas ranges from about 0.25 to about 0.50.

2. A method according to claim 1, wherein said metal-comprising masking material is selected from the group consisting of aluminum, cadmium, copper, chromium, gallium, indium, iron, magnesium, manganese, nickel, and combinations thereof.

3. A method according to claim 2, wherein said metal-comprising masking material is aluminum.

4. A method according to claim 3, wherein said aluminum-comprising masking material is a combination of aluminum and copper, with other constituents totaling less than about 2.0% by weight.

5. A method according to claim 3, wherein said aluminum-comprising masking material is aluminum in combination with less than about 8.0% by weight magnesium, with other constituents totaling less than about 2.0% by weight.

6. A method according to claim 3, or claim 4, or claim 5, wherein said fluorine-comprising plasma etchant is generated from a compound selected from the group consisting of $NF_3$, $CF_4$, $CHF_3$, $CH_2F_2$, $CH_3F$, $C_4F_8$, $SF_6$, $SiF_4$, and combination thereof.

7. A method according to claim 6, wherein said plasma feed gas additionally includes HBr to assist in etch profile control.

8. A method according to claim 1, wherein the pressure in a process chamber in which said plasma etching is carried out ranges from about 5 mTorr to about 50 mTorr.

9. A method according to claim 1, wherein a bias power applied to said silicon substrate ranges from about 10 W to about 100 W.

10. A method for plasma etching features in a silicon substrate, wherein the depth of etching into said silicon substrate is at least 100 µm, the method includes using a metal-comprising masking material selected from the group consisting of aluminum, cadmium, copper, chromium, gallium, indium, iron, magnesium, manganese, nickel, and combinations thereof, in combination with a fluorine-comprising plasma etchant generated from a plasma feed gas which comprises a fluorine-containing compound and oxygen, wherein an atomic ratio of oxygen:fluorine in said plasma feed gas ranges from about 0.25 to about 0.50.

11. The method of claim 10, wherein said plasma feed gas includes HBr.

12. The method of claim 10, wherein said method is carried out at a pressure ranging from about 20 mTorr to about 50 mTorr.

13. The method of claim 10, wherein said method is carried out at a pressure ranging from about 5 mTorr to about 50 mTorr.

* * * * *